United States Patent [19]
Ho

[11] Patent Number: 6,046,421
[45] Date of Patent: Apr. 4, 2000

[54] PCB ADAPTER FOR A TEST CONNECTOR ASSEMBLY FOR AN AUTOMATIC MEMORY MODULE HANDLER FOR TESTING ELECTRONIC MEMORY MODULES

[75] Inventor: Cecil Chong Ho, Irving, Tex.

[73] Assignee: Computer Service Technology, Inc., Dallas, Tex.

[21] Appl. No.: 08/965,611

[22] Filed: Nov. 6, 1997

[51] Int. Cl.$^7$ .................................................. B07C 5/344
[52] U.S. Cl. .......................................... 209/573; 109/571
[58] Field of Search ..................................... 209/573, 571

[56] References Cited

U.S. PATENT DOCUMENTS

| | | |
|---|---|---|
| 4,829,241 | 5/1989 | Maelzer . |
| 5,109,596 | 5/1992 | Driller et al. . |
| 5,192,907 | 3/1993 | Bonaria . |
| 5,266,059 | 11/1993 | Taylor . |
| 5,345,170 | 9/1994 | Schwindt et al. . |
| 5,434,512 | 7/1995 | Schwindt et al. . |
| 5,477,161 | 12/1995 | Kardos et al. . |
| 5,559,445 | 9/1996 | Eaddy et al. . |
| 5,563,509 | 10/1996 | Small . |
| 5,629,632 | 5/1997 | Tsutsumi . |
| 6,625,287 | 4/1997 | Nakamura et al. . |

OTHER PUBLICATIONS

CST Eureka Innovative Memory Tester Brochure.
DM718 Automatic Simm Handler Brochure.

*Primary Examiner*—Donald P. Walsh
*Assistant Examiner*—Brett Martin
*Attorney, Agent, or Firm*—Gregory M. Howison; Mark W. Handley

[57] ABSTRACT

An apparatus is disclosed for automatically testing electronic memory modules. The electronic memory modules are automatically positioned, one at a time, in a test station position for registration with test contacts of a test connector assembly. The test connector assembly includes a mounting fixture which secures the test contacts, such that first ends of the test contacts are appropriately aligned for registering with surface contacts of the electronic memory modules. Second, opposite ends of the test contacts are mounted to a transition board. The transition board has first and second opposite edges, with the first edge having surface contacts which are closely spaced for registering with the test contacts, and the second edge having surface contacts which are more widely spaced than those on the first edge for registering with connector contacts of a tester module. Conductive traces extend between the surface contacts of the first and second edges of the transition board. A transition board stiffener mounting adapter extends forward of and laterally aside of an upper and lower brackets of the mounting fixture. The stiffener adapter has flat mounting surfaces which are disposed adjacent to a flat surface of the transition board and to which the transition board is rigidly secured, to stiffen the transition board and to rigidly mount the transition board to the mounting fixture. A mounting bar rigidly connects the stiffener adapter to two upwardly extending ears of the lower mounting bracket.

5 Claims, 9 Drawing Sheets

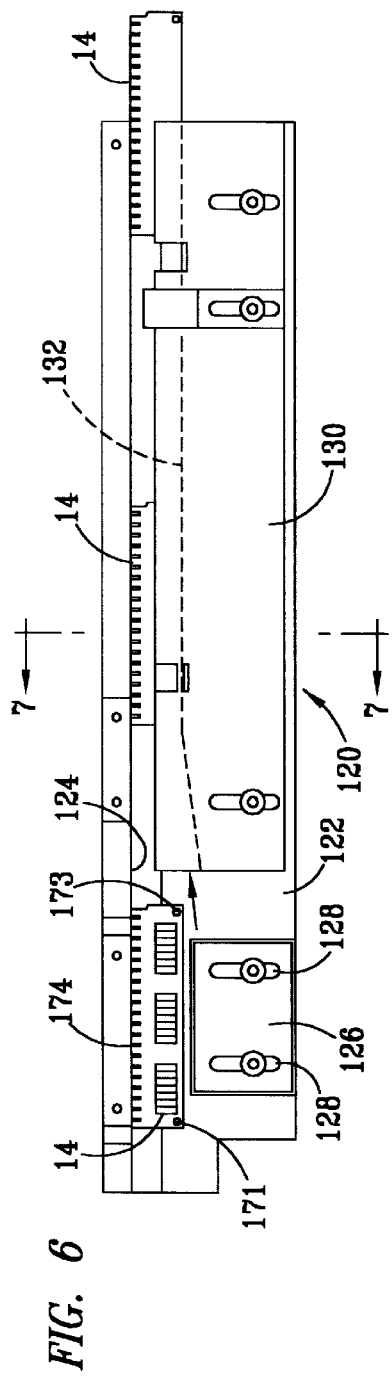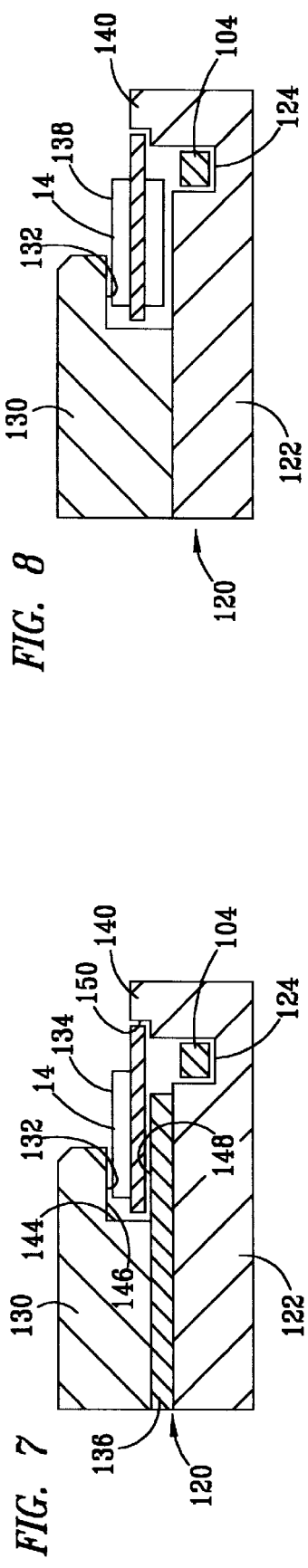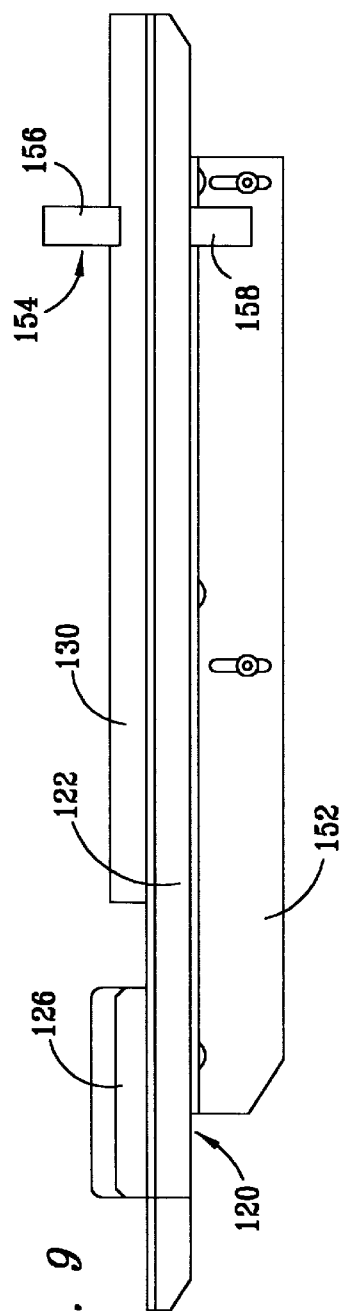

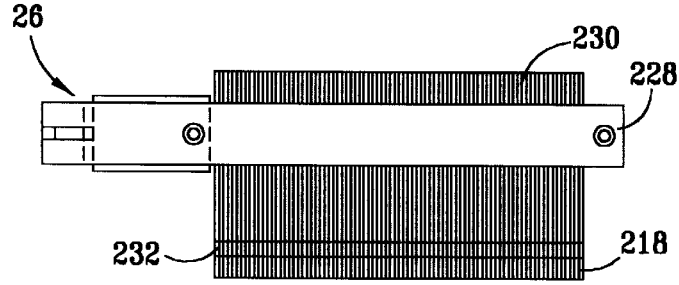
FIG. 13
FIG. 14
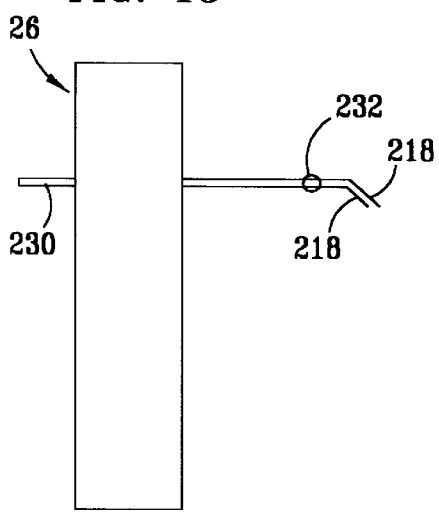
FIG. 15
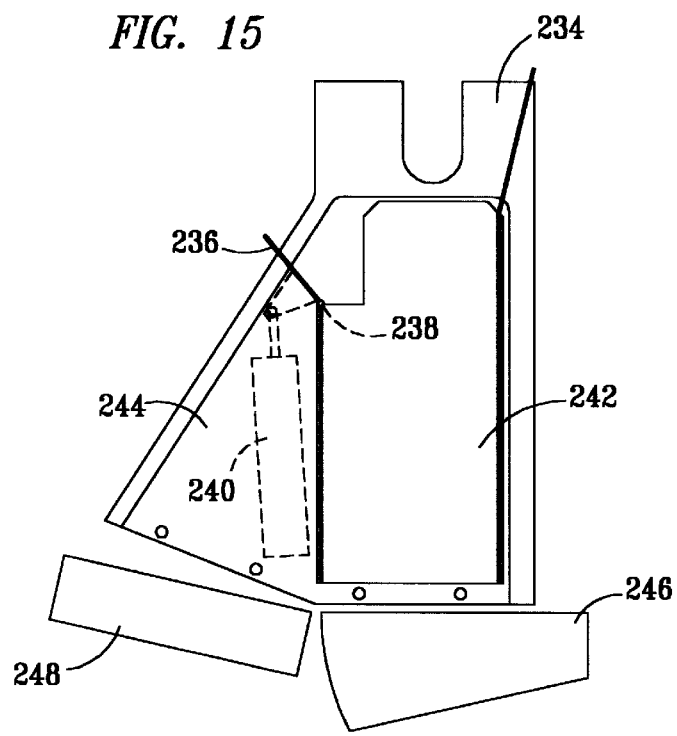
FIG. 16
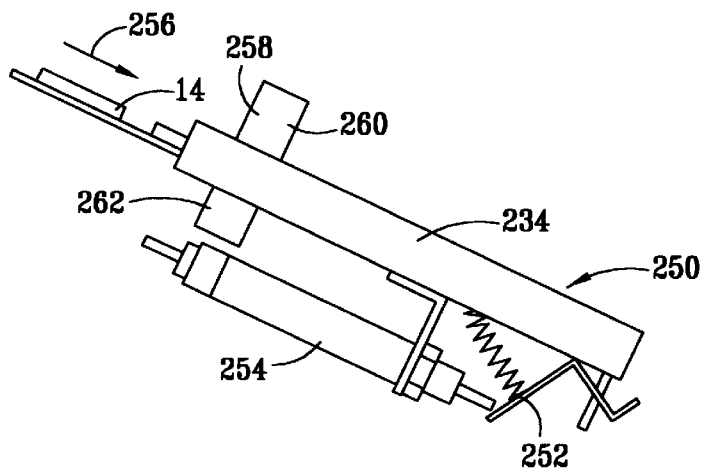

PCB ADAPTER FOR A TEST CONNECTOR ASSEMBLY FOR AN AUTOMATIC MEMORY MODULE HANDLER FOR TESTING ELECTRONIC MEMORY MODULES

TECHNICAL FIELD OF THE INVENTION

The present invention relates in general to electronic test equipment, and in particular to an electronic memory module tester having an automatic feeder handler and alignment assembly.

BACKGROUND OF THE INVENTION

Prior art test equipment includes automatic testers for testing electronic memory modules. The electronic memory modules have typically comprised circuit boards which have random access memory (RAM) integrated circuits mounted thereto. The circuit boards have been provided with surface contact pads which are typically aligned along one edge of the circuit board. This type edge connector configuration has been utilized for connecting the RAM integrated circuit components mounted to the circuit board to data buses of the devices within which the memory modules are used. Such memory modules have included SIMM, DIMM, and SODMM types of memory. Additionally, memory cards may also be utilized having the appearance of a credit card, and also having surface connectors mounted thereto for connecting the internally disposed memory thereof to equipment in which the aforementioned memory module is used.

As is well known in the art, memory modules and the edge connectors therefor have been greatly reduced in size in recent years. The size of the connecter contact members has often been expressed in terms of the distance between corresponding points on adjacent ones of the surface contact pads of the electronic memory modules. Prior art contact pad spacings have been sized from 0.050 to 0.070 inches apart (50 mil to 70 mil). More recently, component spacings of 0.030 inches (30 mil) down to 0.025 inches (25 mil) have been utilized in fabricating electronic memory modules.

Electronic memory modules are typically tested after manufacturing to assure that they will perform properly after installation into a data processing system. Usually, a test connector is removably secured to edge connectors of the electronic memory modules under test to make contact to the surface pads for connecting the electronic memory modules to testing circuitry. In the prior art, automatic memory module test equipment included automatic memory module handlers. These prior art handlers typically utilized a conveyer belt for automatically feeding components through the test equipment. A stop was often utilized which was selectively retractable. The stop was selectively extended to stop the electronic memory module under test in a second position for engaging a connector to electrically connect the electronic memory module under test to the test equipment circuitry. However, recent reductions in the size of spacings between contact pads have reduced the ability of prior art handlers to adequately position the electronic memory modules edge surface contact pads for aligning with the test leads of the test connectors mounted to the handler equipment. This often results in test failures caused by misalignment between the test leads and the surface contact pads. Improvements for more closely aligning electronic memory modules under test with tester equipment connectors are desirable, such that alignment therebetween will be improved and the failure rate of electronic memory modules caused by inadequate testing procedures and equipment will be reduced.

The circuitry of currently existing prior art tester modules may be suitable for testing electronic memory modules of smaller contact pad spacings than those for which the prior art tester modules were initially intended to test. However, the contact spacings of the connectors which are mounted directly to the tester modules for interconnecting the tester module circuitry to test contacts may be of a larger size spacing than the spacing of the test contacts and the spacing of the electronic memory modules to be tested. The tester contacts that are sized for testing the electronic memory modules which have the smaller contact spacings cannot be utilized for directly engaging the larger sized connectors which are mounted directly to the tester modules. Additionally, the circuitry of the tester modules often requires that the conductive paths between the tester circuitry and the electronic memory modules under test have particular impedance values for closely matching to impedance values which are suitable for the tester module circuitry.

SUMMARY OF THE INVENTION

The present invention disclosed and claimed herein comprises an apparatus for automatically disposing an electronic memory module into a testing position, and then engaging the surface contacts of the electronic memory module with test contacts to electrically connect the electronic memory module to test circuitry. A test connector includes a plurality of test contacts which are spaced apart for registering with the surface contacts of the electronic memory module. An automatic feeder is provided for automatically receiving, staging and then dispensing the electronic memory modules onto a conveyor. The conveyor moves the electronic memory modules from the feeder to a test station. A stop is disposed in the appropriate relation to the conveyor and the test connector for engaging the electronic memory module to retain the electronic memory module in a position proximate to a testing position. A contact plunger is moved to push the tester contacts against the surface contacts of the electronic memory module to electrically connect the electronic memory module to the tester circuitry.

A connector assembly is provided for engaging between the test circuitry of a tester module and the surface contacts of the electronic memory module under test. The test contacts extend from a position for registering with and engaging the surface contacts of electronic memory modules under test to the edge surface contacts of a transition board. The edge surface contacts of the transition board have spacings between adjacent ones of the surface contacts which are of a size for closely matching the spacings of the test contacts and the surface contacts of the electronic memory module under test. The opposite side of the transition board has edge surface contacts which are of a much wider spacing than those of the electronic memory module under test and the test contacts. The transition board includes conductive tracks which extend between corresponding ones of the more widely spaced edge contacts of one side of the transition board and the more narrowly spaced edge contacts of the other side of the transition board. The conductive tracks are impedance matched to the tester circuitry. The transition board is mounted to a connector mounting fixture, which includes a transition board stiffener mounting adapter having flat surfaces which engage and fit flush with a substantial surface area of the transition board for rigidly mounting the transition board to the connector mounting fixture.

In a preferred embodiment, two spaced apart pairs of test contacts are provided, one being an upper test contact pair and the other being a lower test contact pair. Two transition boards are spaced apart and rigidly mounted to opposite facing surfaces of the connector mounting fixture. The transition boards electrically connect the test contacts to tester circuitry located within the tester module. The preferred transition boards have edge surface contacts on one side have a wider spacing than the opposite side of the transition board. The opposite facing surfaces of the transition board stiffener mounting adapter of the connector mounting fixture fit flush against substantial portions of the surfaces of the transition boards, such that the transition boards are substantially rigidly mounted to the mounting fixture. Threaded fasteners extend through mounting holes in the transition boards and into the flat surfaces of the stiffener mounting adapter to rigidly mount the transition boards to the stiffener mounting adapter.

BRIEF DESCRIPTION OF THE DRAWINGS

For a more complete understanding of the present invention and the advantages thereof, reference is now made to the following description taken in conjunction with the accompanying Drawings in which:

FIG. 6 illustrates a top plan view of guide rails of the conveyor of the automatic tester of the present invention;

FIG. 7 illustrates a sectional view of the guide rails of the present invention, taken along section line 7—7 of FIG. 6;

FIG. 8 illustrates a sectional view of the guide rails of an alternative embodiment of the present invention, as would be viewed if taken along a section line which is similar to section line 7—7 of FIG. 6;

FIG. 9 illustrates a frontal, elevation view of the guide tracks of the conveyor of the present invention;

FIG. 13 illustrates a side elevation view of the test connector of the testing station of the automatic tester of the present invention;

FIG. 14 illustrates a top plan view of the test connector of the testing station of the automatic tester of the present invention;

FIG. 15 illustrates a top plan view of a discharge chute having an output shuttle for dispensing electronic memory modules from the automatic tester into appropriate staging bins according to whether the electronic memory module passed or failed the testing procedure of the automatic tester of the present invention;

FIG. 16 illustrates a side, elevation view of the discharge chute, a trap door and a trap door actuator of the present invention;

DETAILED DESCRIPTION OF THE INVENTION

Figure 1:
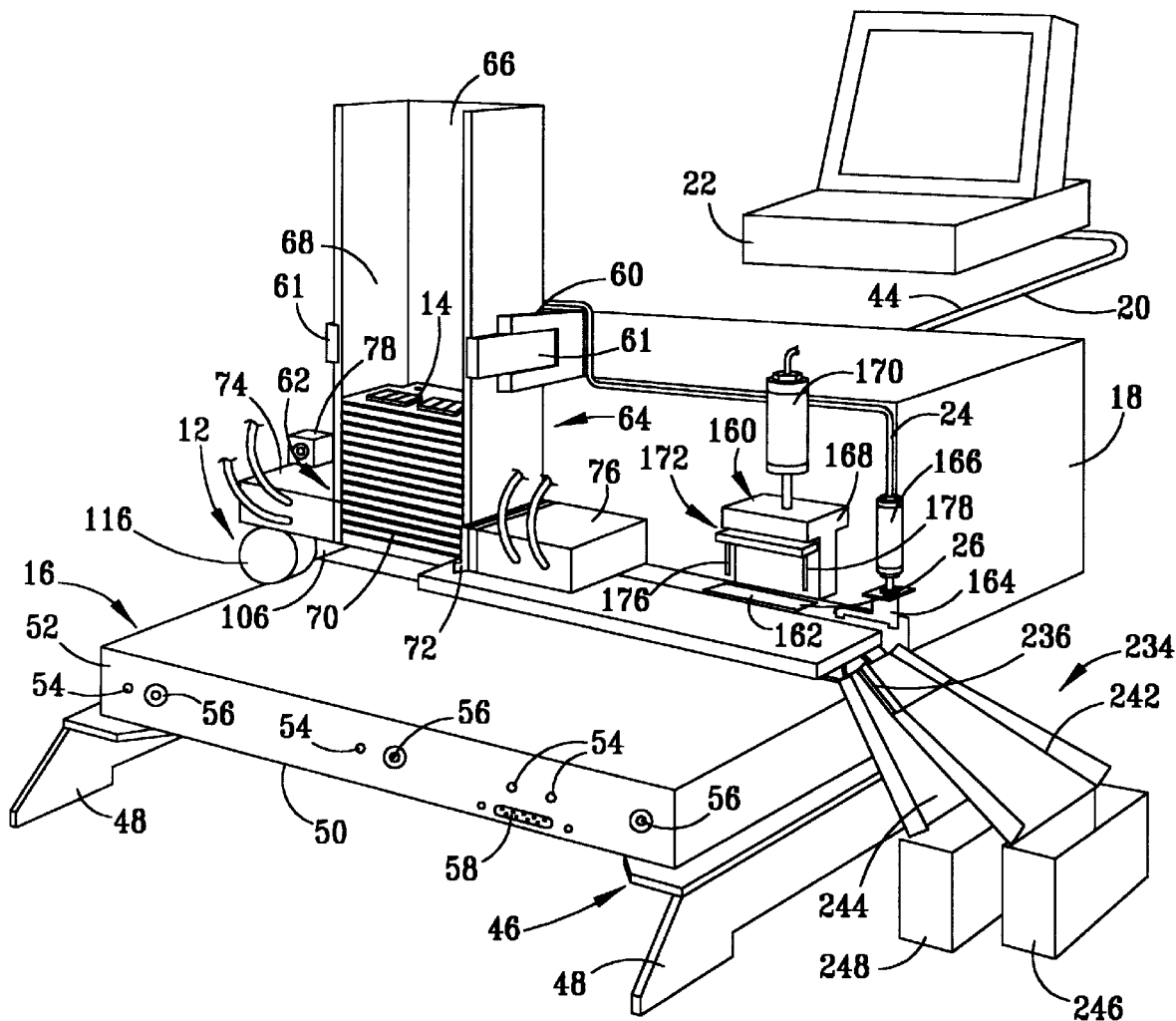
FIG. 1 illustrates a perspective view of the automatic tester for testing electronic memory modules of the present invention.

Referring now to FIG. 1, there is illustrated a perspective view of an automatic tester 12 for testing electronic memory modules 14. The automatic tester 12 includes an automatic memory module handler 16, a tester module 18, a data link 20 and a data processing unit 22. The automatic memory handler is a positioning device which feeds and positions the memory modules, one at a time, in a testing position. Preferably, the tester module 18 is removably secured to the automatic memory module handler 16. The tester module 18 includes test circuitry for, in combination with the data processing unit 22, testing the operability of the electronic memory modules 14.

Figure 2:
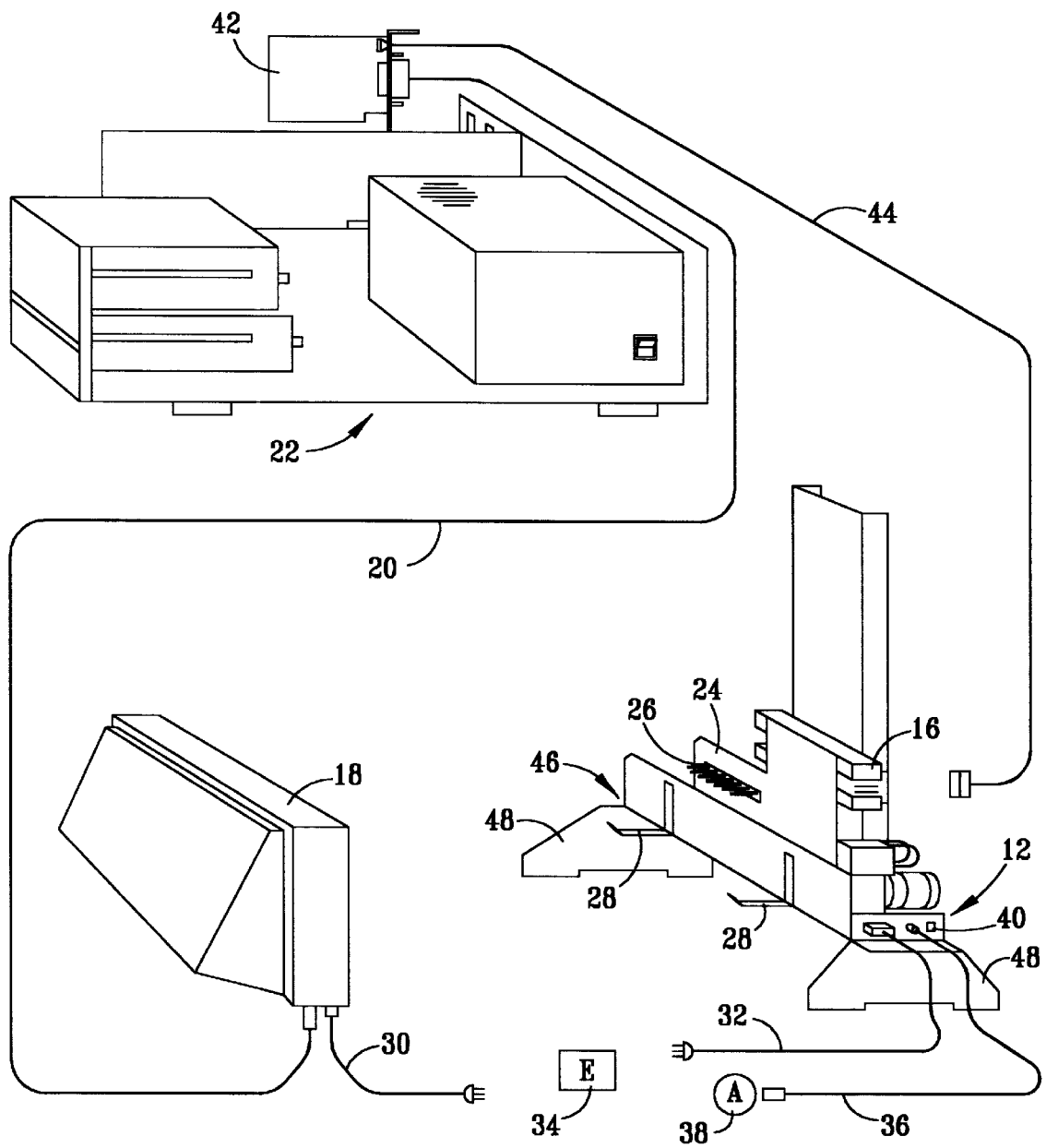
FIG. 2 illustrates a perspective view of the primary components of the automatic tester for electronic memory modules of FIG. 1.

Referring now to FIG. 2, there is illustrated a perspective view of the pnmary components of the automatic tester 12. The automatic memory module handler 16 has a back plate 24 through which a rear portion of a connector 26 extends. The connector 26 connects to the tester module 18. Two mounting brackets 28 extend from the lower portion of the back plate 24 for removably securing the tester module 18 to the automatic memory module handler 16. Power cords 30 and 32 are provided for electrically connecting the tester module 18 and the automatic memory module handler 16, respectively, to an electrical outlet 34, which provides an electrical power supply. Pneumatic tubing 36 is provided for connecting the pneumatic components of the automatic memory module handler 16 to an air supply 38. A main power on/off switch 40 is mounted to the automatic memory module handler 16. An interface 42 is provided by an I/O board which mounts inside the data processing unit 22. Preferably, the data processing unit 22 is a conventional PC which is connected to the tester module 18 by the data link 20 and to the handler 16 by the control cable 44. In the preferred embodiment, the data link 20 is preferably a standard PC peripheral interface cable. The automatic memory module handler 16 is connected to the data processing unit 22 by the control cable 44 which, in the preferred embodiment, is a ribbon cable having a DB15 connector for connecting to the front face of the automatic memory module handler 16.

Referring again to FIG. 1, the automatic memory module handler 16 has a frame 46 which includes two stands 48. A housing 50 encloses logic control components for the automatic memory module handler 16, such as pneumatic solenoid valves which are electrically actuated to control operation of various pneumatic components of the automatic memory module handler 16. A control panel 52 is mounted to provide the front face for the automatic memory module handler 16. The control panel 52 includes various control components such as LEDs 54 and control switches 56. A data port 58 is provided for connecting the DB15 connector of the control cable 44 to the automatic memory module handler 16.

The automatic memory module handler 16 further includes an automatic feeder 62. The automatic feeder 62 includes a feed guide 64 which provides a feed chute for feeding the electronic memory modules 14. The feed guide 64 includes an upper opening 66, a staging section 68 and an outlet 70. A feed gate 72 meters the flow of the electronic memory modules 14 from within the staging section 68 and through the outlet 70 of the feed guide 64. The feed gate 72 includes a feed control unit 74 and a feed control unit 76, which are preferably pneumatic. A staging sequencer switch 78 is provided for operating to sequence the feed control units 74 and 76 according to the appropriate stage of processing of the electronic memory modules 14 through the automatic tester 12.

Figure 3:
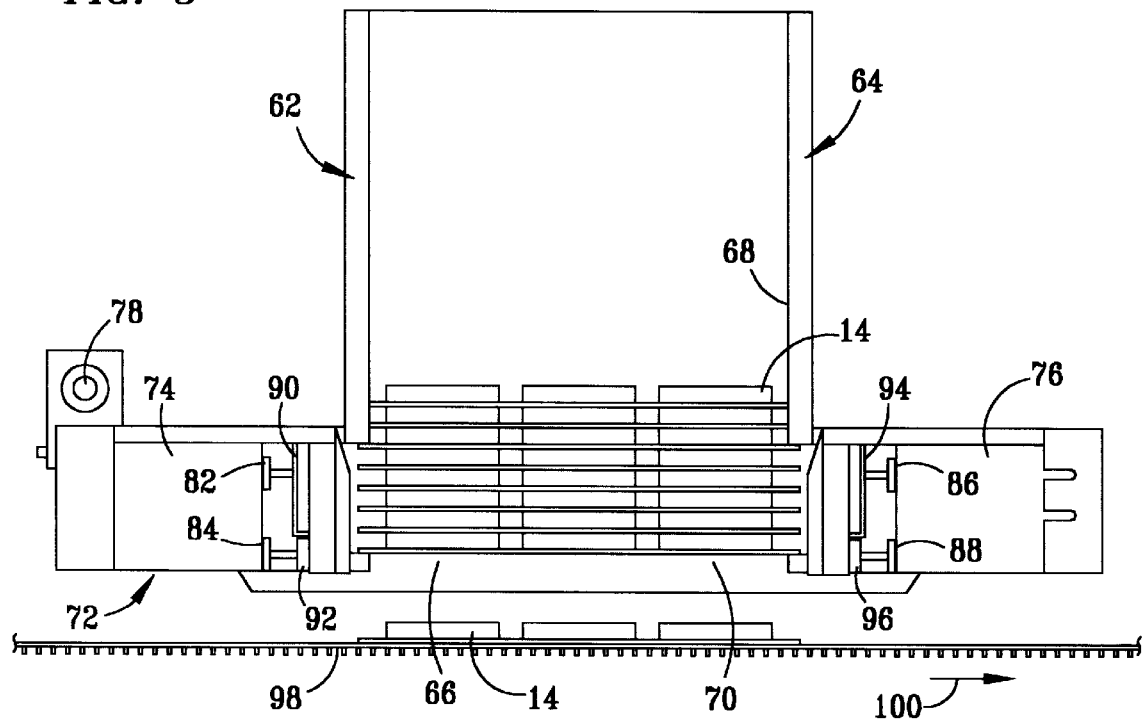
FIG. 3 illustrates a partial frontal elevation view of the electronic memory module feeder of the automatic tester of the present invention.
Figure 4:
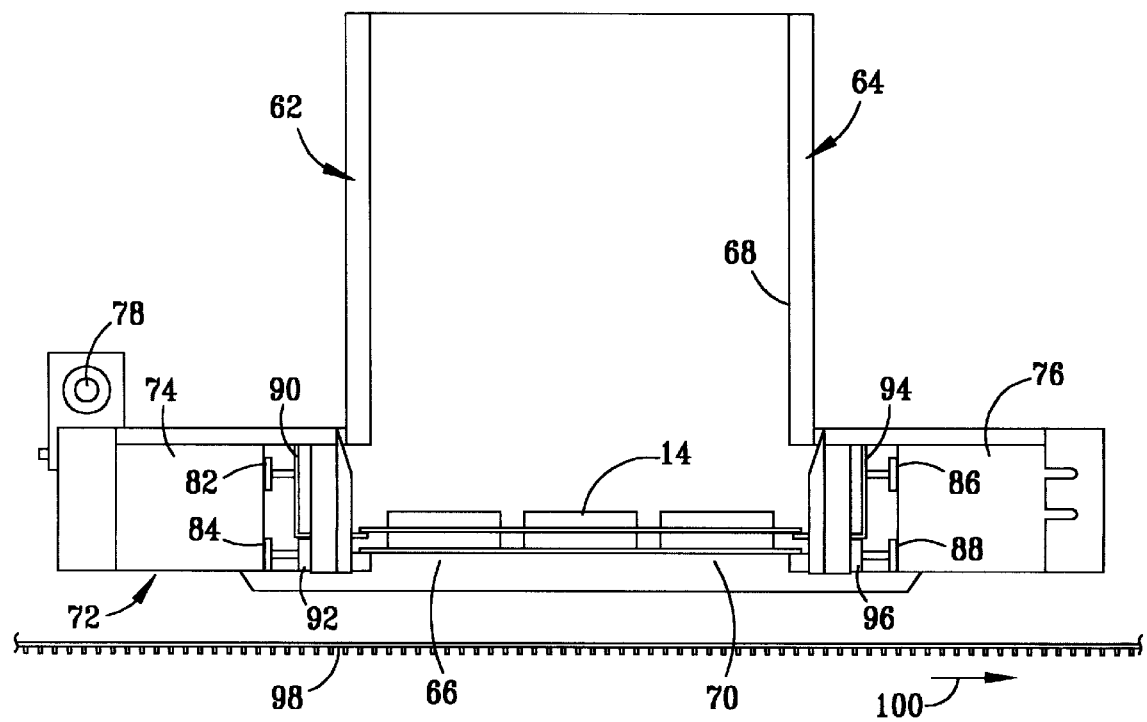
FIG. 4 illustrates a partial frontal elevation view of the electronic memory module feeder for the automatic tester of FIG. 3, after operation thereof to dispense electronic memory modules therefrom.

Referring now to FIGS. 3 and 4, there are illustrated frontal, elevation views depicting operation of the automatic feeder 62 of the automatic tester 12. The feed control units 74 and 76 of the automatic feeder 62 each include two pneumatic actuators. The feed control unit 74 includes an upper actuator 82 and a lower actuator 84, and the feed control unit 76 includes an upper actuator 86 and a lower actuator 88. Each of the actuators 82, 84, 86 and 88 are connected to a respective one of retaining members 90, 92, 94 and 96. The plungers of the actuators 82, 84, 86 and 88 are connected to the retaining members 90, 92, 94 and 96 for selectively actuating to control the flow of the electronic memory modules 14 from within the staging section 68 of the feed guide 64 of the automatic feeder 62. As depicted in FIG. 3, the electronic memory modules 14 are first stacked upon the lower retaining members 92 and 96. Then, as depicted in FIG. 4, the upper actuators 82 and 86 are selectively actuated to extend respective ones of the upper retaining members 90 and 94 inward into the outlet 70 of the feed guide 64. The upper surfaces of the upper retaining members 90 and 94 are spaced apart above the upper surfaces of lower retaining members 92 and 96 such that when the lower retaining members 92 and 96 are extending beneath one of the electronic memory modules 14, the upper retaining members 90 and 94 will extend immediately below the bottom surface of the one of the electronic memory modules 14, which is immediately above the electronic memory module 14 which is resting directly on top of the lower retaining members 92 and 96.

The lower actuators 84 and 88 may be selectively actuated to withdraw the lower retaining members 92 and 96 from extending beneath the lowermost one of the electronic memory modules 14, such that it will fall upon a conveyor 98. When the lower retaining members 92 and 96 have been retracted, the upper retaining members 92 and 94 will support the remainder of the electronic memory modules 14 from falling downward through the outlet 70 of the feed guide 64. Then, the lower actuators 84 and 88 will be actuated to extend the lower retaining members 92 and 96 inward within the outlet 70, followed by the upper actuators 82 and 86 being actuated to retract the upper retaining members 90 and 94 from extending inward within the outlet 70 such that the stack of the remaining electronic memory modules 14 will fall downward upon the upper surface of the lower retaining members 92 and 96. The above process will then be repeated so that each one of the electronic memory modules 14 of the stack of the modules 14 will be singularly fed, one at a time, upon the conveyor 98 to control the flow of the memory modules 14 from within the feed guide 64. This flow of the electronic memory modules 14 is controlled such that it is appropriately sequenced with operation of the tester module 18. The conveyor 98 is moved such that the memory modules 14, when fed upon the conveyor 98, are moved in a direction 100.

Figure 5:
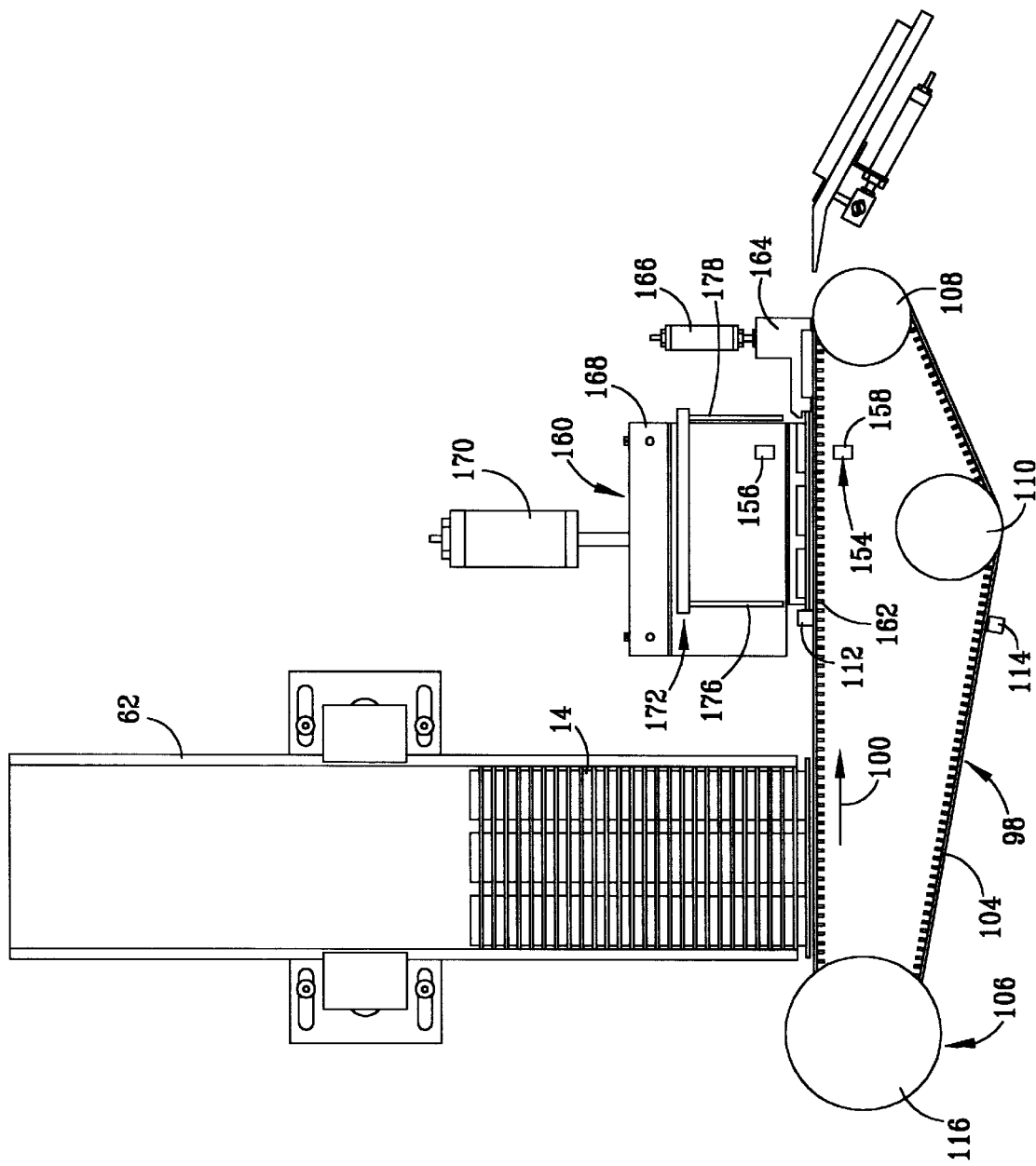
FIG. 5 illustrates a partial frontal elevation view of the electronic memory module feeder and the conveyor of the automatic tester of the present invention.

Referring now to FIG. 5, there is illustrated a partial, front elevation view of the automatic tester 12, depicting the automatic feeder 62 and the conveyor 98 of the present invention. The conveyor 98 preferably includes a fourteen-inch toothed belt 104, a drive motor 106, a guide wheel 108, an idler wheel 110, and two protruding members 112 and 114 which extend upward from the belt 104 in two places. Preferably, the two protruding members 112 and 114 are provided by two belt clips which are one-quarter (¼) inches tall. The drive motor 106 is preferably a stepper motor 106, which has a manual control knob 116 mounted to the drive shaft thereof. The stepper motor 106 is controlled by the data processing unit 22 in a preferred mode of operation. The stepper motor 106 is selectively actuated such that the protruding members 112 and 114 will engage respective ones of the electronic memory modules 14 as they are dispensed upon the belt 104 to push the respective ones of the electronic memory modules 14 in the direction 100. When an electronic memory module 14 is appropriately positioned for testing, the stepper motor 106 may be stopped.

Referring now to FIG. 6, there is illustrated a top plan view of a guide track 120 of the conveyor 98 of the present invention. The guide track 120 includes a lower guide rail 122 having a groove 124 extending therein to provide a channel for the belt 104 (shown in FIG. 5) to extend beneath the electronic memory modules 14 as the modules 14 are dispensed from within the automatic feeder 62 (shown in FIG. 5). A feed stop 126 is provided by a slotted plate, which has slots 128 and which is mounted upon the lower guide rail 122. The feed stop 126 prevents the electronic memory modules 14 from extending forward of an appropriate position above the groove 124 for feeding through the guide track 120. An upper guide rail 130 is mounted to the lower guide rail 122, and includes a guide notch 132 for feeding the electronic memory modules 14 between the lower guide rail 122 and the upper guide rail 130. The electronic memory modules 14 are fed in the direction 100.

Referring now to FIG. 7, there is illustrated a sectional view of the guide track 120, taken along section line 7—7 of FIG. 6. The electronic memory module 14 passing through the guide track 120 is depicted as a single-sided memory module 134. Preferably, when the single-sided memory module 134 is passed through the guide track 120, a spacer 136, provided by a plate or shim, extends between the lower guide rail 122 and the upper guide rail 130 to lift the bottom of the single-sided memory module above the top or upper surface of the lower guide rail 122. As can be seen, the notch 132 and the upper guide rail 130 provide guide surfaces 144 and 146 for guiding the electronic memory module 14 as it passes through the guide track 120. Similarly, the upper surface of the spacer 136 provides a guide surface 148, and a retaining lip 140 of the lower guide rail 122 extends upward to provide a guide surface 150 for guiding the electronic memory module 14 through the guide track 120 of the present invention.

Referring now to FIG. 8, there is depicted an alternative embodiment of the guide track 120, in which the spacer 136 has been removed from extending between the lower guide rail 122 and the upper guide rail 130 so that the guide track 120 will accommodate types of electronic memory modules other than the single-sided memory modules 134 (shown in FIG. 7), such as the double-sided memory module 138 depicted in FIG. 8. It should be noted that the same components may be utilized for the lower guide rail 122 and the upper guide rail 130 as are utilized in FIG. 7. They are preferably removably connected so that the spacer 136 (depicted in FIG. 7) can be easily removed and then later reinstalled.

Referring now to FIG. 9, there is illustrated a frontal, elevation view of the guide track 120 of the automatic memory module handler 16 of the automatic tester 12 of the present invention. The guide track 120 is mounted to the frame 46 (depicted in FIG. 1) of the automatic memory module handler 16 of the automatic tester of the present invention by a guide track mounting bracket 152. Preferably, the guide track mounting bracket 152 is slotted to allow for adjustment to align the guide track 120 with other components of the automatic memory module handler 16. Additionally, a position sensor 154 is mounted to the guide track 120 for detecting when the electronic memory modules 14 are passing a particular point on the guide track 120 in order to allow proper sequencing of the various components of the automatic memory module handler 16. The position sensor 154 is preferably provided by an optical sensor, which includes an optical signal emitter 156 and an optical signal sensor 158 for picking up an optical signal emitted by the optical signal emitter 156. When one of the electronic memory modules 14 passes between the optical signal emitter 156 and the optical signal sensor 158, it will break the optical signal being transmitted therebetween, providing a position signal to the data processing unit 22 (depicted in FIGS. 1 and 2).

Referring now to FIGS. 1 and 5, the automatic memory module handler 16 includes a testing station 160 for testing the electronic memory modules 14 when they are proximately disposed in a testing position 162. A stop 164 is controlled by an actuator 166, which is preferably provided by a pneumatic actuator, for stopping the progress of the electronic memory modules 14 in the direction 100 when they are disposed proximate to the testing position 162. The position sensor 154 (not shown in FIG. 1) is provided for detecting when a leading edge of the electronic memory module 14 which is passing in the direction 100 is approaching the testing position 162. Then, the actuator 166 will be operated to move the stop 164 downward and into the path of the leading edge of the electronic memory module 14. Once the electronic memory module 14 is disposed proximately within the testing position 162, a contact plunger 168 is moved downward by an actuator 170. Preferably, the actuator 170 is a pneumatic actuator. An alignment assembly 172 is rigidly mounted to the contact plunger 168 and includes two alignment pins 176 and 178. The pins 176 and 178 extend vertically downward for engaging within alignment holes 171 and 173 (shown in FIG. 6) of the electronic memory modules 14. When the contact plunger 168 is moved downward by the actuator 170, the alignment pins 176 and 178 will pass into the alignment holes 171 and 173 (shown in FIG. 6) of the electronic memory module 14 to appropriately align the electronic memory module 14 in the testing position 162, such that surface contacts 174 (shown in FIG. 6) of the electronic memory modules 14 will be appropriately aligned for mating with test contacts 218 of the forward facing portion of the connector 26, as will be discussed below in more detail.

Referring now to FIG. 6, there is illustrated one of the electronic memory modules 14, having surface contacts 174 provided on the edge thereof and the alignment holes 171 and 173. Preferably, the alignment holes 171 and 173 are formed into the electronic memory modules 14 during fabrication of various portions of the electronic memory modules 14.

Figure 10:
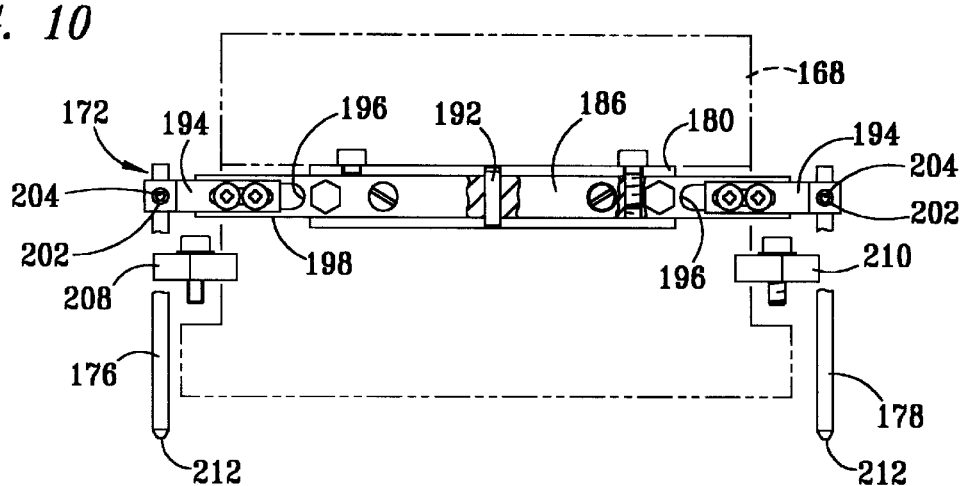
FIG. 10 illustrates a frontal elevation view of an alignment assembly of the test station of the automatic tester of the present invention.
Figure 11:
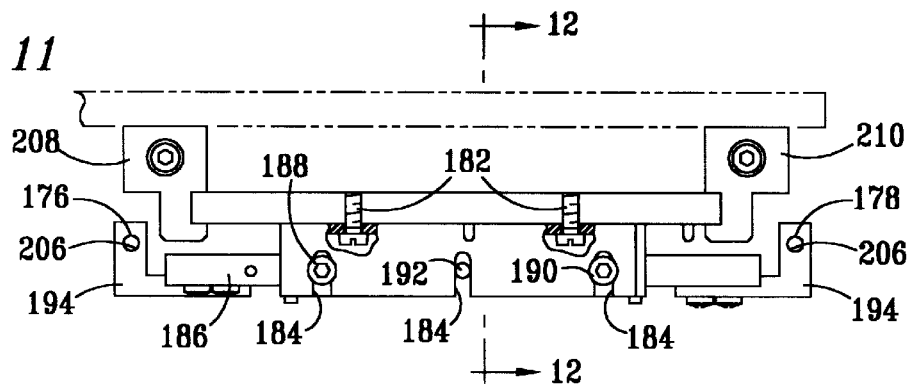
FIG. 11 illustrates a top plan view of the alignment assembly of the test station of the automatic tester of the present invention.
Figure 12:
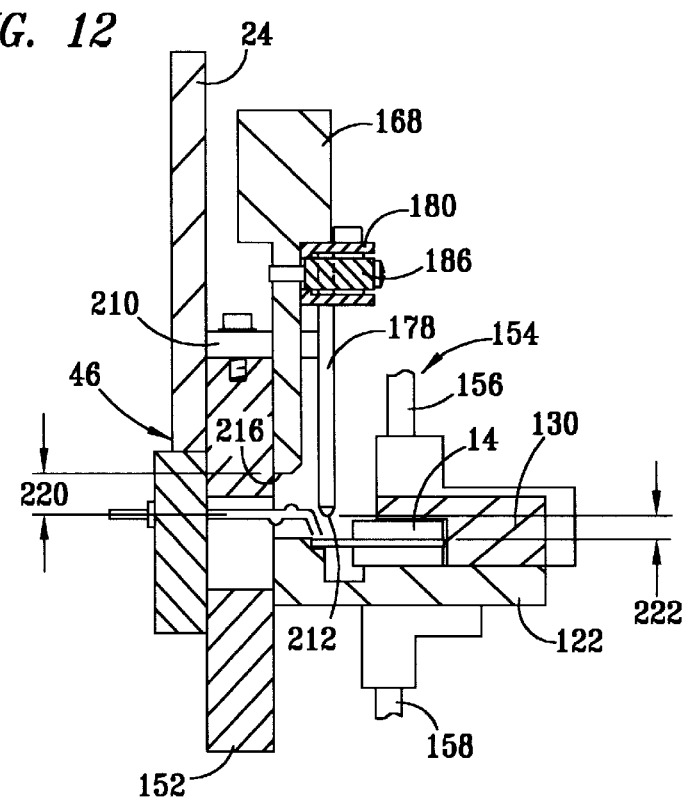
FIG. 12 illustrates a sectional view of the alignment assembly of the test station of the automatic tester of the present invention, taken along section line 12—12 of FIG. 11.

Referring now to FIGS. 10, 11 and 12, there are respectively illustrated a front elevation view, a top plan view, and a sectional view taken along section line 12—12 of FIG. 11, each of which depict the alignment assembly 172 of the automatic memory module handler 16 of the automatic tester 12. A channel member 180 is fastened directly to the contact plunger 168 (shown in phantom in FIGS. 10 and 11) by two threaded fasteners 182. A support member 186 has an exterior profile for fitting within the channel member 180, and is secured therein by threaded fasteners 188 and 190 and a pivot pin 192. The channel member 180 has three slots 184 formed into the top portion thereof, which are spaced apart and extend parallel to one another and perpendicular to the longitudinal length of the channel member 180. The positioning of the support member 186 relative to the channel member 180 is determined by moving the threaded fasteners 188 and 190, and the pivot pin 192 within the slots 184 formed into the channel member 180.

Two support arms 194 are mounted within grooves 196 which extend on opposite sides of the support member 186, parallel to a longitudinal length of the support member 186. The grooves 196 are symmetrical, extending on opposite longitudinal sides of the support member 186. The support member 186 is mounted to the channel member 180 so that, preferably, the grooves 196 face outward toward the front of the automatic memory module handler 16 of the automatic tester 12, on an opposite side from that of the channel member 180.

The support arms 194 extend within the grooves 196, and are slidably adjustable relative thereto. The support arms 194 are latched into position by the threaded fasteners 198. The outward ends of the support arms 194 have clamps 202 which are provided by two threaded fasteners 204 that are threadingly engaged to the support arms 194. Two holes 206 extend perpendicular to the longitudinal length of the support arms 194, the support member 186 and the channel member 180. The alignment pins 176 and 178 will extend downward through the holes 206. The threaded screws 204 extend radially into the holes 206 and the outward ends of the support arms 194 for clamping respective ones of the alignment pins 176 and 178. Plunger guides 208 and 210 are provided for guiding the contact plunger as it moves upwardly and downwardly in response to actuation of the actuator 170. The lowermost, terminal ends of the alignment pins 176 and 178 have rounded tips 212. The rounded tips 212 provide tapered surfaces and act as guide surfaces for guiding the alignment pins 176 and 178 into respective ones of the alignment holes 171 and 173 of the electronic memory module 14. Preferably, the alignment pins 176 and 178 are rigidly secured to the contact plunger 168. Entry of the alignment pins 176 and 178 into the respective ones of the alignment holes 171 and 173 will selectively position the electronic memory module 14 into the testing position 162.

The position of the tips 212 of the lowermost ends of the alignment pins 176 and 178 are selectively adjustable to be movable in the x, y and z direction by adjusting the support member 186 with respect to the channel member 180, by adjusting the position of the support arms 194 with respect to the support member 186, and by adjusting the position of the alignment pins 176 and 178 within the clamps 202 of the support arms 194. Movement of the support member 186 within the channel member 180 is accomplished by pivoting the support member 186 about the pivot pin 192 in a horizontal plane which is spaced apart above the testing position 162. The threaded fasteners 188 and 190 are loosened to allow the support member 186 to be pivoted about the pivot pin 192 until a line extending longitudinally through the lowermost tips 212 of the alignment pins 176 and 178 will be aligned above the alignment holes 171 and 173 (shown in FIG. 6). The support member 186 may slide inward toward the front face of the contact plunger 168, or outwardly therefrom, by sliding the threaded fasteners 188 and 190 and the pivot pin 192 within the three slots 184 formed in the top of the channel member 180 to move the support member 186 in a horizontal plane.

The support arms 194 may be moved in a lineal direction relative to the support member 186, which is parallel to the horizontal plane in which the support member 186 is moveable within the channel member 180, by slidingly engaging the support arms 194 in the grooves 196 which extend within the support member 186. The support member 186 and the support arms 194 are adjusted so that the tips 212 of the alignment pins 176 and 178 are disposed directly above the alignment holes 171 and 173 (shown in FIG. 6) of the electronic memory modules 14 when they are disposed within the testing position 162 (shown in FIG. 1). Then, the tips 212 of the alignment pins 176 and 178 are adjusted to extend an appropriate vertical distance above the alignment holes 171 and 173 (shown in FIG. 6). The clamps 202 are manipulated by adjusting the threaded screws 204 and sliding the alignment pins 176 and 178 relative to the support arms 194 such that the tips 212 of the alignment pins 176 and 178 are moved to an appropriate vertical distance above the testing position 162. Thus, the tips 212 of the alignment pins 176 and 178 are adjustable in three degrees of freedom for properly aligning the tips 212 of the alignment pins 176 and 178 for registering within the alignment holes 171 and 173 (shown in FIG. 6) of the electronic memory modules 14 to position the memory modules 14 into the testing position 162 according to the present invention.

Preferably, the tips 212 will be aligned a distance 222 above the tops of respective ones of the alignment holes 171 and 173 (shown in FIG. 6) of the electronic memory modules 14, which will be sufficiently greater than the distance from the tip 216 of the contact plunger 168, such that the tips 212 of the alignment pins 176 and 178 will fully enter into and pass through the upper opening of respective ones of the alignment holes 171 and 173 prior to the tip 216 of the plunger 168 engaging the top of one of the test contacts 218 of the connector 26. Stated alternatively, the distance 220 between the tip 216 of the terminal end of the plunger 168, which engages the test contacts 218 to push them downward onto the surface contacts 174 (shown in FIG. 6), is sufficiently greater than the distance 222 between the top of the portion of the electronic memory module 14 in which the respective ones of the alignment holes 171 and 173 (shown in FIG. 6) extend, such that the distance 222 is less than the distance 220 to allow the tips 212 of the alignment pins 176 and 178 to pass fully within the respective ones of the alignment holes 171 and 173 to locate the electronic memory module 14 in the testing position 162 at the testing station 160 (shown in FIG. 5) prior to the tip 216 of the lowermost terminal end of the contact plunger 168 pressing downward upon the top of the test contacts 218 to press them into the surface contacts 174 (shown in FIG. 6) of the electronic memory module 14.

Referring now to FIGS. 13 and 14, there are respectively illustrated a side elevation and a top plan view of the connector 26, which is mounted to the automatic memory module handler 16 of the automatic tester 12 of the present invention. Preferably, the connector 26 is of a type conventionally used in the industry, known as a double-blade type Kelvin connector. The connector 26 includes a contactor block 228. On the rearward side is a tester module contact section 230, which is defined by the rearward ends of the test contacts 218. The forward, opposite ends of the test contacts 218 are pressed directly against the surface contacts 174 (shown in FIG. 6) of the electronic memory modules 14. A non-conductive, plastic support rib 232 provides a spacer which extends between upper and lower ones of the test contacts 218 such that they will not be bent to press against one another. The tester module 18 (shown in FIG. 2) is mounted directly to the frame 46 of the automatic memory module handler 16 of the automatic tester 12 of the present invention, secured directly to the back plate 24, and connects directly to the tester module contact section 230. Thus, single, solid test contacts 218 connect the surface contacts of the electronic memory modules 14 directly to the tester circuitry included within tester module 18 (shown in FIG. 2).

Referring now to FIG. 15, there is illustrated a top plan view of the discharge chute 234 of the present invention. The discharge chute 234 includes an output shuttle 236 which is connected to a rotation pin 238. A shuttle actuator 240 will actuate the output shuttle 236 to selectively move it such that an electronic memory module 14 moving through the discharge chute 234 will either move through a pass discharge section 242 or a failure discharge section 244, according to the position in which the output shuttle 236 is placed by the shuttle actuator 240. The shuttle actuator 240 is operated in accordance with the test results determined at the testing station 160 (depicted in FIGS. 1 and 5), such that electronic memory modules 14 which do not pass the operational testing will be caused to pass through the failure discharge chute section 244 to a failure collection bin 248. Those of the electronic memory modules 14 which pass the electronic testing will pass through the pass discharge section 242 and into the pass collection bin 246.

Referring now to FIG. 16, there is depicted a side elevation view of the discharge chute 234. A trap door 252 is provided in the bottom of the discharge chute 234. An actuator 254 is connected to the trap door 252 for selectively operating such that components which are erroneously passed into the pass discharge section 242 of the chute 234 will be retained therein by the trap door 252. A sensor 258 detects when electronic memory modules 14 are moving in a direction 256 through the pass discharge section 242, instead of passing through the failure discharge section 244. The sensor 258 is preferably an optical sensor which includes an emitter 260 and an optical sensor 262. If an erroneous feed into the pass discharge chute section 242 is detected, then the actuator 254 will be operated to push the trap door 252 upwards to retain the misfed component 14 in the section 242, and an alarm will sound to alert an operator to remove the one of the electronic memory modules 14 which failed the testing.

Figure 17:
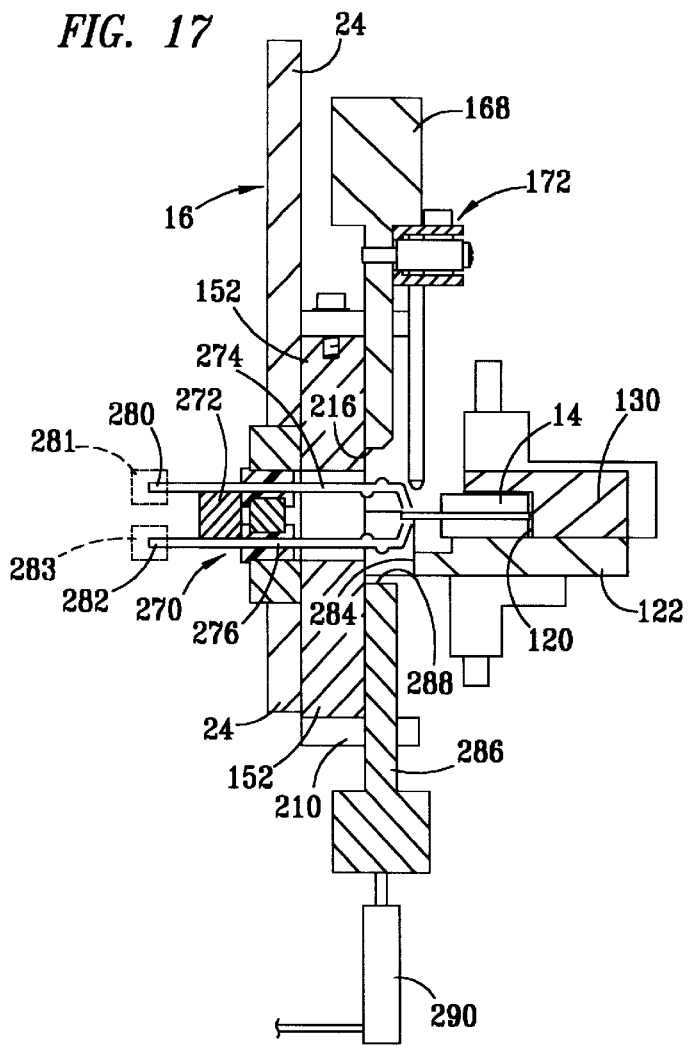
FIG. 17 illustrates a sectional view of the alignment assembly of the test station of the automatic tester having a test connector assembly of a preferred embodiment of the present invention installed therein, taken along section line 12—12 of FIG. 11.

Referring now to FIG. 17, there is illustrated a sectional view of the alignment assembly 172 of the automatic memory module handler 16 of the automatic tester 12, with a preferred test connector assembly 270 installed therein, as would be viewed if taken along section line 12—12 of FIG. 11. The test connector assembly 270 includes a test connector mounting fixture 272. The test connector mounting assembly 270 further includes upper test contacts 274 and lower test contacts 276, which preferably are each spaced apart pairs of spaced apart test contacts that are of the same type as the test contacts 218 utilized in the connector 26 (shown in FIGS. 13 and 14). An upper transition board 280 and a lower transition board 282 are mounted to the test connector mounting fixture 272, and have edge finger-type contacts to which respective ones of the upper test contacts 274 and the lower test contacts 276 are connected, preferably by being soldered thereto. The upper and lower transition boards 280 and 282 adapt between the upper and lower test contacts 274 and 276, respectively, to respective ones of tester module connectors 281 and 283 (shown in phantom) of the tester module 18. The connectors 281 and 283 of the tester module 18 have electrical contacts which are spaced apart at a wider spacing than that of the upper and lower test contacts 274 and 276, and the surface contacts of the electronic memory modules 14. For example, the spacing of the contacts of the tester module connectors 281 and 283 of the tester module 18 may be of a 0.005 to 0.007 inch lead spacing. However, the transition board will adapt a tester module 18 designed for a 0.005 to 0.007 inch lead spacing for use with upper and lower test contacts 274 and 276, which preferably have a spacing of and are utilized for testing memory modules 14 having lead spacings of 0.003 to 0.0025 inches.

A space 284 is formed in the bottom of the lower guide rail 122 to accommodate a second, lower plunger member 286. The lower plunger member 286 is slidably disposed beneath the upper plunger 168, with the end tip 288 of the lower plunger member 286 facing the tip 216 of the upper plunger 168. A second set of plunger guides 208 and 210 (one shown) slidably engage the edges of the lower plunger member 286 for guiding the plunger member 286 to reciprocate in a lineal direction. A second plunger actuator 290 is provided for reciprocating the plunger member 286 to press the lower test contacts 276 into the lower facing surface contacts of the memory module 14 under test to make electrical connections therebetween.

Figure 18:
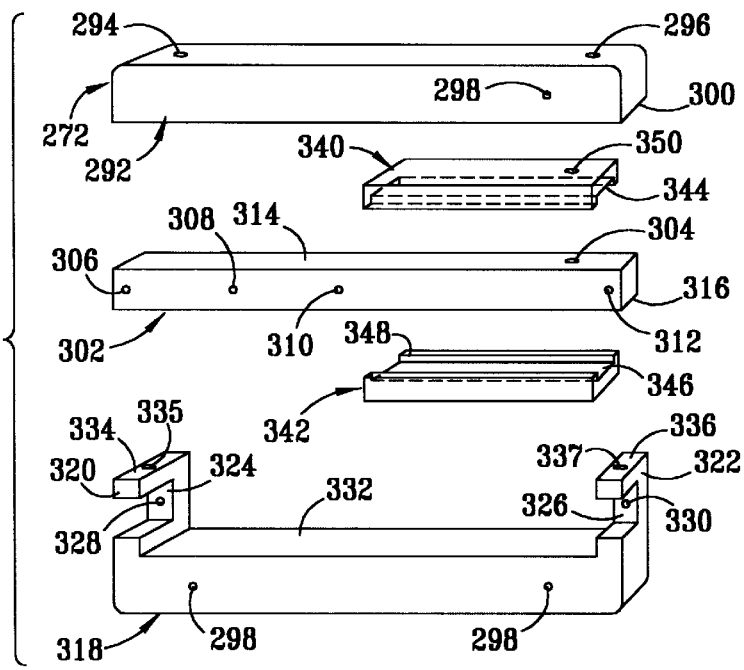
FIG. 18 illustrates a combined exploded and perspective view of a connector mounting fixture made according to the present invention.

Referring now to FIG. 18, there is illustrated a combined perspective and exploded view of the test connector mounting fixture 272. The test connector mounting fixture 272 includes an upper bracket 292. Holes 294, 296 and 298 are formed into the upper bracket 292 for using threaded fasteners to mount the upper bracket 292 to the remainder of the test connector mounting fixture 272. Three mounting holes 298 are provided for securing the mounting fixture 272 to the automatic memory module handler 16. These mounting holes 298 are recessed. The upper bracket 292 further includes a flat, downwardly facing surface 300.

A mounting bar 302 is provided by a rectangular-shaped bar, which has flat surfaces that are orthoginally disposed to adjacent ones of the flat surfaces. Mounting holes 304, 306, 308, 310 and 312 are provided. The mounting holes 308 and 310 are interiorly threaded. The mounting bar 302 further includes the flat, upwardly facing, upper surface 314 and a flat, downwardly facing, lower surface 316. The upper surface 314 matingly engages the lower surface 300 of the upper bracket 292, fitting flush therewith. The flat surface 316 matingly engages a surface 332 of a lower bracket 318, fitting flush therewith.

The lower bracket 318 has two upwardly extending tabs 320 and 322 which provide mounting ears which upwardly extend for engaging the mounting bar 302. The tab 320 has a notch 324 formed therein, and the tab 322 has a notch 326 formed therein. A threaded hole 328 is formed in the surface of the notch 324, and a threaded hole 330 is formed in the surface of the notch 326. The profiles of the notches 324 and 326 are defined for matching and fitting flush with the exterior profile with the mounting bar 302. The flat surface 332 of the lower bracket 318 is provided for engaging and fitting flush with the lower surface 316 of the mounting bar 302, as discussed above. Flats 334 and 336 are provided on the uppermost, upwardly facing surfaces of the upwardly protruding tabs 320 and 322, respectively, for engaging the lower surface of and fitting flush with the end portions of the lower surface 300 of the upper bracket 292. Threaded holes 335 and 337 are provided on respective one of the flats 334 and 336 for securing threaded fasteners therein, to extend downwardly through the holes 294 and 296, respectively, in the upper bracket 292 for securing the upper bracket 292 to the lower bracket 318.

A pair of longitudinally elongated spacers 340 and 342 are provided with longitudinally extending grooves 344 and 346, respectively, such that longitudinally extending ears 348 are defined to extend on opposite sides of the grooves 344 and 346. The ears 344 and 348 extend the full, longitudinal length of the spacers 340. The elongated spacers 340 and 342 have the grooves 344 and 346 defined therein such that the profile of the grooves 344 and 346 will fit flush with the respective ones of the upper and lower surfaces 314 and 316 of the mounting bar 302, with the longitudinally extending ears 348 holding the spacers 340 and 342 in position, saddled upon the mounting bar 302 when the mounting bar 302 is secured within the mounting ears 320 and 322 of the lower bracket 318, and the upper bracket 292 is secured to the lower bracket 318.

Figure 19:
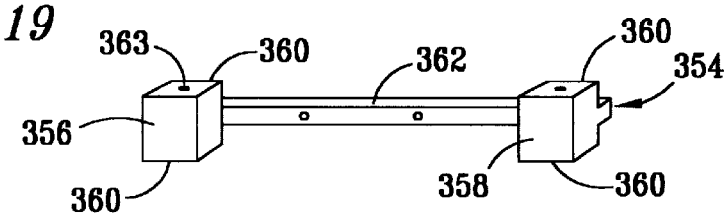
FIG. 19 illustrates a perspective view of a transition board mounting adapter made according to the present invention.

Referring now to FIG. 19, there is illustrated a perspective view of a transition board stiffener mounting adapter 354 of the connector mounting fixture 272. The transition board mounting adapter 356 includes two vertically-extending spacers 356 and 358. The spacers 356 and 358 are spaced apart for extending along the oppositely facing, opposed surfaces of spaced-apart transition boards 280 and 282, adjacent to opposite edges of the transition boards 280 and 282. The transition board spacers 356 and 358 includes spaced-apart, flat engagement surfaces 360, each of which have a threaded hole 362 extending therein. The oppositely-facing ones of the spaced-apart flat surfaces 360 of each of the spacers 356 and 358 are preferably parallel, for fitting flush with the surfaces of flat, spaced-apart transition boards 280 and 282 (shown in FIG. 17). The connecting member 362 extends between the spaced-apart, vertically extending spacers 356 and 358. The height of the connecting member 362 is significantly less than the height of the vertically-extending spacers 356 and 358, and preferably engages a rearward facing side, with regard to FIG. 19, of each of the vertically-extending spacers 356 and 358, with the connecting member 362 connected to the center or substantially in the center of the rearward sides to which it engages. The connecting member 362 and the two spacers 356 and 358 are machined from a solid stock of aluminum block to provide a singular, one-piece construction for the stiffener adapter 354.

Figure 20:
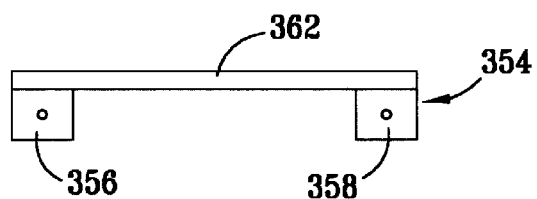
FIG. 20 illustrates a top view of the transition board mounting adapter of the present invention.

Referring now to FIG. 20, there is illustrated a top view of the transition board stiffener adaptor 354. The spacers 356 and 358 are spaced apart, with a connecting member 362 extending therebetween. The connecting member 362 is extending between the spacers 356 and 358 such that the profile of the transition board stiffener adapter 354 is generally U-shaped, with the spacers 356 and 358 extending forward of the connecting member 362.

Figure 21:
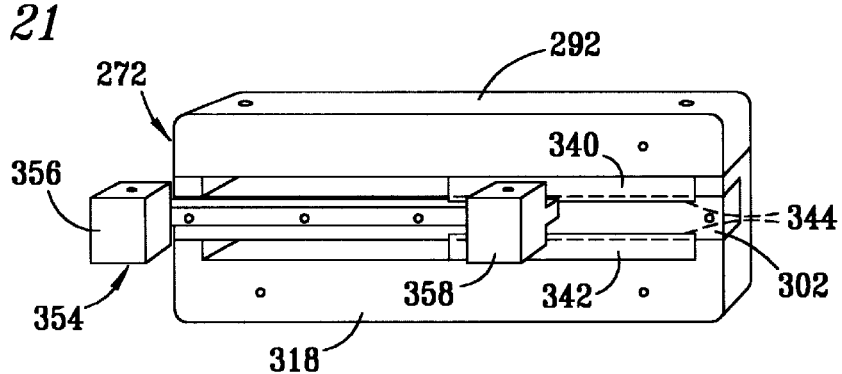
FIG. 21 illustrates a perspective view of the connector mounting fixture and the transition board mounting adapter when fully assembled.

Referring now to FIG. 21, there is illustrated a perspective view of the test connector mounting fixture 272 after it is fully assembled, prior to receiving a set of upper and lower test contacts 274 and 276 (shown in FIG. 17). It should also be noted that a single set of only the upper test contacts 274, or only the lower test contacts 276, may be utilized according to the present invention for testing single-sided types of memory module 14. The elongated spacers 340 and 342 have been mounted to the mounting bar 302, with the mounting bar 302 extending within the grooves 324 and 326 of the respective one of the longitudinally extending mounting ears 320 and 322. The mounting bar 302 is then secured to the lower bracket 318 with threaded fasteners. The upper bracket 292 is then threadingly secured to the lower bracket 318 with threaded fasteners. Then, preferably, the transition board stiffener adapter 354 is threadingly secured to the mounting bar 302 with threaded fasteners, such that spacer 356 is offset and to the side of the mounting bar 302 and the mounting brackets 292 and 318, and spacer 358 is disposed within a central region of the test connector mounting fixture 272.

Figure 22:
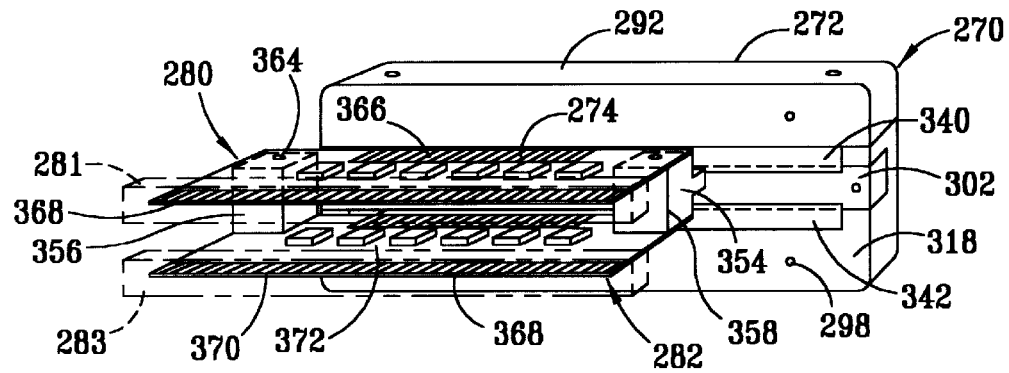
FIG. 22 illustrates a perspective view of the test connector assembly of the present invention.

Referring now to FIG. 22, there is illustrated a perspective view of the test connector assembly 270 after it has been fully assembled, such that the upper and lower test contact pairs 274 and 276, and the transition boards 280 and 282, are secured to the test connector mounting fixture 272. Prior to mounting the transition boards 280 and 282, and the test contacts 274 and 276 to the test connector mounting fixture 272, respective ones of the test contacts 274 and 276 are preferably permanently mounted to the respective ones of the transition boards 280 and 282 by soldering. The transition boards 280 and 282 are mounted to and fit flush with the engagement surfaces 360 of the opposite faces of the spacers 356 and 358 of the transition board stiffener adapter 354 by threaded fasteners 364. It should be noted that each of the transition boards 280 has a narrowly spaced set of edge-finger type contacts 366, and a more widely spaced set of finger type contacts 368, on opposite sides of each of the transition boards 280 and 282. The contacts 368 connect to the tester module connectors 281 and 283 (shown in phantom). The transition boards 280 and 282 are preferably printed circuit boards having conductive tracks 370 which extend from narrow edge-finger type surface contacts 366 and 368 for electrically connecting therebetween. A plurality of capacitors 372 are provided for impedance matching of the test circuits extending through the tracks 370 and various ones of the upper and lower test contacts 274 and 276 for use with the circuitry of the tester module 18. Preferably, the edge contacts 366 and the upper and lower test contact pairs 274 and 276 are slightly offset, by half a lead spacing, to match the surface contact spacings of the memory modules 14, which are offset on opposite sides.

The test connector 270 is fully assembled according to the following process. The upper and lower test contacts 274 and 276 are preferably soldered to the narrowly spaced apart edge surface contacts 366 of respective ones of the transition boards 280 and 282. The transition boards 280 and 282 are then secured to the transition board stiffener adapter 354 with the transition boards 280 and 282 being spaced apart by engaging the upper and lower flat engagement surfaces 360 of the vertically extending spacers 356 and 358. Then, the transition board stiffener adapter 354 is rigidly secured to the mounting bar 302 by threaded fasteners, with the transition board stiffener adapter 354 preferably being offset from the mounting bar 302 to extend aside of the mounting bar 302 in two dimensions, one dimension being to the left of, and the other dimension being forward of the mounting bar 302, as shown in FIGS. 21 and 22. The elongated spacers 340 and 342 are then secured to one longitudinal side of the mounting bar 302, such that the longitudinally extending ears 344 thereof extend on opposite forward and rearward sides of the mounting bar 302, as shown in FIG. 21. Then, the mounting bar 302, the transition board mounting adapter 354, the upper and lower transition boards 280 and 282, and the upper and lower test contacts 274 and 276 having been previously secured together into a single rigid assembly, are slid rearward such that the outward ends of the mounting board 302 engage within the notches 324 and 326 of the mounting ears 320 and 322 of the lower bracket 318. As the mounting bar 302 is slid rearward, the longitudinally extending spacers 340 and 342 are held in place. Then, the mounting bar 302 is rigidly secured within the upwardly extending ears 320 and 322 of the lower bracket 318 by threaded fasteners. The upper bracket 292 is then placed atop the lower mounting bracket 218 and secured thereto with threaded fasteners. Then, the entire test connector assembly 270 is secured to the back plate 24 and the guide track mounting bracket 152 of the automatic memory module handler 16 of the automatic tester 12.

In operation, the electronic memory modules 14 are placed within the staging section 68 of the feed guide 64 of the automatic feeder 62. Then, the feed gate 72 will be operated as discussed above in reference to FIGS. 3 and 4 to operate the feed control units 74 and 76 to selectively pass the electronic memory modules 14, one at a time, from within the feed guide 64, through the outlet 70, and into the guide track 120 of the conveyor 98. One of the protruding members 112 and 114 of the conveyor belt 104 will then engage the trailing edge of the respective one of the electronic memory modules 14 disposed upon the guide track 120. The electronic memory modules 14 then pass through the guide track 120, and to the position sensor 154. In the preferred embodiment, the electronic memory modules 14 pass between the optical signal emitter 156 and the optical signal sensor 158 to interrupt the optical signal passing therebetween. In response to the interruption of optical signal passing between the emitter 156 and the sensor 158, the pneumatic actuator 166 will be operated to move the stop 164 downward such that the leading edge of the electronic memory module 14 will engage the stop 164, disposing the electronic memory module 14 at least approximately in the testing position 162 adjacent to the testing station 160. This provides a gross positioning of the electronic memory module 14 relative to the testing position 162.

The contact plunger 168 is then actuated to move downward such that the tips 212 of the alignment pins 176 and 178 will pass into the alignment holes 171 and 173 of the electronic memory module 14. When the electronic memory module 14 is proximately disposed in the testing position by being located within the guide track 120 and engaging the stop 164, the tips 212 of the alignment pins 176 and 178 will approximately register with the alignment holes 171 and 173 of the electronic memory module 14, such that when the plunger 168 moves downward, the tips 212 of respective ones of the alignment pins 176 and 178 will pass into the appropriate ones of the alignment holes 171 and 173 of the electronic memory module 14. Since the tips 212 are rounded, entry of the tips 212 into the alignment holes 171 and 173 will cause the surface contacts 174 of the electronic memory module 14 to align appropriately for registering with the terminal end tips of the test contacts 218 of the connector 26. This provides a fine positioning, or micropositioning, of the electronic memory module 14 relative to the testing position 162. Then, as the contact plunger 168 is pushed further downward, the tip 216 on the terminal end of the plunger 168 will engage the tops of the upper set of the test contacts 218 and push the terminal end tips of the two rows of the test contacts 218 downward and against the surface contacts 174 of the electronic memory modules 14. The test contacts 218 then electrically connect the electronic memory module 14 to the tester module 18, which is directly connected to the rear section 230 of the test contacts 218. The programmable controller 22 will then be operated to perform operational testing of the electronic memory module 14.

After the operational testing of the electronic memory modules 14, the contact plunger 168 will be lifted upward such that the two rows of tester contacts 218 are released from pressing against the surface contacts 174 of the electronic memory modules 14. Then, the end tips 212 of the alignment pins 176 and 178 are removed from respective ones of the alignment holes 171 and 173 of the electronic memory modules 14. Once the contact plunger 168 is in the upward position, the actuator 166 will be actuated to lift the stop 164 upward such that the electronic memory module 14 will pass from the testing station 160 to the discharge station 234. When the stop 164 is lifted, a shuttle 236 is appropriately positioned for passing the tested electronic memory module 14 through either the pass chute 242 to the pass bin 248, or through the failure chute 244 to the failure bin 248.

The electronic memory module tester of the present invention provides several advantages over prior art automatic testers for electronic memory modules. The electronic memory modules are automatically fed into the automatic tester and onto a conveyor having a guide track. The electronic memory modules are then transported by conveyor to an appropriate testing position, and automatically positioned in a precise testing position to allow testing of electronic memory modules. The surface contacts of the electronic memory modules have a much smaller spacing than those of memory modules which were automatically positioned and then tested by prior art testers. Alignment pins are provided for directly engaging within the alignment holes of the electronic memory module units under test to correctly align the surface contacts of the electronic memory modules in the precise testing position for being engaged directly by the test contacts of a test connector which directly interconnects the electronic memory module unit under test and tester module circuitry.

The test connector preferably includes transition boards, having tracks which are impedance matched, for use in testing electronic memory modules of a much smaller spacing than the tester module was initially intended to test. The electronic memory module tester of the present invention further includes a pair of spaced apart transition boards which extend from the test contacts to a connector mounted directly to the tester module. The tester module connector has a much larger contact spacing than that of the test contacts and the surface contacts of the electronic memory modules under test.

The transition boards are mounted to the automatic memory handler by a mounting fixture. The mounting fixture includes a transition board mounting adapter which has two spaced apart vertical spacers. The two vertical spacers each have two flat surfaces on oppositely facing sides. The transition boards are directly mounted to the oppositely facing surfaces to provide support for the transition boards such that the outward, more widely spaced edges of the upper and lower transition boards will be rigidly secured to the connector mounting fixture. The oppositely facing surfaces of the two spacers fit flush against the transition boards such that the transition boards will not substantially flex or deform under normal force loading, and instead will maintain a regular alignment with the connector mounting fixture such that the interconnection between the upper and lower transition boards and respective ones of the upper and lower test contacts will not be damaged by flexion of the transition boards in engaging with the connectors of the tester modules.

Although the preferred embodiment has been described in detail, it should be understood that various changes, substitutions and alterations can be made therein without departing from the spirit and scope of the invention as defined by the appended claims.

What is claimed is:

1. An apparatus for automatically disposing electronic memory modules into a testing position, and then testing the electronic memory modules, wherein the electronic memory modules have surface contacts which are engaged to electrically connect to the electronic memory modules to perform the testing, the apparatus comprising:

a tester module having circuitry for testing the electronic memory modules;

a test connector having a plurality of test contacts which are spaced apart for registering with at least part of the surface contacts of the electronic memory modules for electrically connecting the electronic memory modules to said tester module when the electronic memory modules are disposed in the testing position;

a feed guide having a staging section for receiving a plurality of the electronic memory modules and retaining the electronic memory modules in a singular alignment in readiness for dispensing and testing, and an outlet for dispensing the electronic memory modules from within said staging section, one at a time;

a feed gate for metering a flow of said electronic memory modules from within said staging section and through said outlet of said feed guide;

a conveyor having a conveyor belt for moving the electronic memory modules from said outlet of said feed guide to the testing position, and a guide track which includes guide rails having spaced apart guide surfaces for guiding the electronic memory modules from said outlet of said feed guide to the testing position, in which the surface contacts of the electronic memory modules are aligned for electrically connecting to said tester contacts of said connector;

a stop disposed in relation to said conveyor and said connector for engaging the electronic memory modules moved by said conveyor and retaining the electronic memory modules in position proximate to the testing position;

a contact plunger for actuating to push said test contacts against the surface contacts of the memory module to electrically connect the electronic memory module to said tester module;

a test connector mounting fixture having a stiffener adapter secured thereto, wherein said stiffener adapter includes at least two pairs of spaced apart, oppositely facing flat engagement surfaces;

two transition boards rigidly mounted to said mounting fixture, such that flat surfaces of said transition boards are aligned substantially adjacent to said spaced apart, oppositely facing flat engagement surfaces of said test connector mounting fixture, such that said transition boards are stiffened by being disposed adjacent to said spaced apart, oppositely facing flat engagement surfaces and disposed in a spaced apart alignment for registering with said test contacts of said test connector;

said transition boards having surface contacts of two different contact spacings, a first spacing for registering with said test contacts and a second spacing, which is wider than said first spacing, for registering with test module connectors to electrically connect conductive traces of said transition boards to said test circuitry of said tester module to electrically connect the electronic memory module to the tester module; and an output shuttle for receiving the electronic memory modules from the testing position and sorting the electronic memory modules according to failed modules and passed modules.

2. The apparatus according to claim 1, wherein said test connector mounting fixture further comprises:

a lower bracket having two upwardly extending mounting ears and a recessed area extending therebetween, each of said two mounting ears having a notch which extends from a laterally disposed side thereof;

an upper bracket having a lowermost, flat surface, said lowermost flat surface secured to upper surfaces of said two mounting ears, with said recessed area of said lower bracket extending immediately beneath said lowermost surface of said upper bracket;

said test contacts having an insulator body disposed within said recessed area, such that first ends of said test contacts extend from one side of said test connector mounting fixture for engaging directly against said electronic memory modules, and second ends of said test contacts extend from the opposite side of said test connector mounting fixture for engaging said transition boards;

a mounting bar extending between said two mounting ears of said lower bracket, with oppositely disposed longitudinal ends of said mounting bar disposed in respective ones of said notches in said mounting ears; and wherein said stiffener adapter is mounted directly to said mounting bar, such that said stiffener adapter is offset to extend, at least partially, to one side of said mounting bar and said upper and lower brackets of said test connector mounting fixture.

3. The apparatus according to claim 2, wherein said stiffener adapter of said test connector mounting fixture further comprises:

two vertically extending spacers, which are spaced apart to define oppositely disposed, laterally spaced apart sides of said stiffener adapter, and each of which define one pair of said flat, spaced apart engagement surfaces;

a connecting member which extends between said two vertically extending spacers, such that said two vertically extending spacers and said connecting member together define a generally U-shaped profile for said stiffener adapter; and wherein said connecting member has a vertical thickness which is substantially less than the spacing between spaced apart pairs, of oppositely facing ones of said engagement surfaces which correspond to each of said vertically extending spacers, and said connecting member is disposed to extend substantially intermediate between said spaces apart pairs, of said oppositely facing ones of said engagement surfaces.

4. The apparatus according to claim 3, further comprising:

two threaded fasteners which extend through mounting holes extending through said transition boards and said flat engagement surfaces, and into said vertically extending spacers to rigidly secure said transition boards to said flat engagement surfaces of said stiffener adapter.

5. An apparatus for automatically disposing electronic memory modules into a testing position, and then testing the electronic memory modules, wherein the electronic memory modules have surface contacts which are engaged to electrically connect to the electronic memory modules to perform the testing, the apparatus comprising:

a tester module having circuitry for testing the electronic memory modules;

a test connector having a plurality of test contacts which are spaced apart for registering with at least part of the surface contacts of the electronic memory modules for electrically connecting the electronic memory modules to said tester module when the electronic memory modules are disposed in the testing position;

a feed guide having a staging section for receiving a plurality of the electronic memory modules and retaining the electronic memory modules in a singular alignment in readiness for dispensing and testing, and an outlet for dispensing the electronic memory modules from within said staging section, one at a time;

a feed gate for metering a flow of said electronic memory modules from within said staging section and through said outlet of said feed guide;

a conveyor having a conveyor belt for moving the electronic memory modules from said outlet of said feed guide to the testing position, and a guide track which includes guide rails having spaced apart guide surfaces for guiding the electronic memory modules from said outlet of said feed guide to the testing position, in which the surface contacts of the electronic memory modules are aligned for electrically connecting to said tester contacts of said connector;

a stop disposed in relation to said conveyor and said connector for engaging the electronic memory modules moved by said conveyor and retaining the electronic memory modules in position proximate to the testing position;

a contact plunger for actuating to push said test contacts against the surface contacts of the memory module to electrically connect the electronic memory module to said tester module;

a lower bracket having two upwardly extending mounting ears and a recessed area extending therebetween, each of said two mounting ears having a notch which extends from a laterally disposed side thereof, an upper bracket having a lowermost, flat surface, said lowermost flat surface secured to upper surfaces of said two mounting ears, with said recessed area of said lower bracket extending immediately beneath said lowermost surface of said upper bracket;

said test contacts having an insulator body disposed within said recessed area, such that first ends of said test contacts extend from one side of said upper and lower brackets for engaging directly against said electronic memory modules, and second ends of said test contacts extend from the opposite side of said connector mounting fixture for engaging said transition boards;

a mounting bar extending between said two mounting ears of said lower bracket, with oppositely disposed longitudinal ends of said mounting bar disposed in respective ones of said notches in said mounting ears;

said stiffener adapter having two vertically extending spacers, which are spaced apart to define oppositely disposed, laterally spaced apart sides of said stiffener adapter, and each of which define one pair of flat, spaced apart engagement surfaces;

said stiffener adapter further including a connecting member which extends between said two vertically extending spacers, such that said two vertically extending spacers and said connecting member together define a generally U-shaped profile for said stiffener adapter;

said connecting member having a vertical thickness which is substantially less than the spacing between spaced apart pairs, of oppositely facing ones of said engagement surfaces which correspond to each of said vertically extending spacers, and wherein said connecting member is disposed to extend substantially intermediate between said spaces apart pairs, of said oppositely facing ones of said engagement surfaces;

wherein said stiffener adapter is mounted directly to said mounting bar, such that said stiffener adapter is offset to extend, at least partially, to one side of said mounting bar and said upper and lower brackets;

two transition boards rigidly mounted to said stiffener adapter, with flat surfaces of said transition boards are aligned substantially adjacent to said spaced apart, oppositely facing flat engagement surfaces of said stiffener adapter, such that said transition boards are stiffened by being disposed adjacent to said spaced apart, oppositely facing flat engagement surfaces and disposed in a spaced apart alignment for registering with said test contacts of said test connector;

said transition boards having surface contacts of two different contact spacings, a first spacing for registering with said test contacts and a second spacing, which is wider than said first spacing, for registering with tester module connectors to electrically connect conductive traces of said transition board to the test circuitry of the tester module to electrically connect the electronic memory module to the tester module;

four threaded fasteners, each of which extends through respective ones of mounting holes extending through said transition boards and respective ones of said flat engagement surfaces of said stiffener adapter, and into corresponding ones of said vertically extending spacers to rigidly secure said transition boards to said flat engagement surfaces of said stiffener adapter; and an output shuttle for receiving the electronic memory modules from the testing position and sorting the electronic memory modules according to failed modules and passed modules.

* * * * *